United States Patent
Tang et al.

(10) Patent No.: US 7,550,340 B2
(45) Date of Patent: Jun. 23, 2009

(54) SILICON RICH BARRIER LAYERS FOR INTEGRATED CIRCUIT DEVICES

(75) Inventors: Sanh Dang Tang, Boise, ID (US); Chris Braun, Boise, ID (US); Farrell M. Good, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/120,555

(22) Filed: May 14, 2008

(65) Prior Publication Data

US 2008/0220572 A1    Sep. 11, 2008

Related U.S. Application Data

(60) Division of application No. 11/625,846, filed on Jan. 23, 2007, now Pat. No. 7,405,447, which is a continuation of application No. 11/430,792, filed on May 9, 2006, now Pat. No. 7,211,479, which is a continuation of application No. 10/929,174, filed on Aug. 30, 2004, now Pat. No. 7,071,049, which is a division of application No. 10/212,561, filed on Aug. 5, 2002, now Pat. No. 6,903,425.

(51) Int. Cl.
H01L 21/8238 (2006.01)
H01L 29/76 (2006.01)
H01L 29/94 (2006.01)

(52) U.S. Cl. .............................. 438/207; 257/E21.584

(58) Field of Classification Search ................. 438/207
See application file for complete search history.

(56) References Cited

U.S. PATENT DOCUMENTS

| | | |
|---|---|---|
| 5,639,687 A | 6/1997 | Roman et al. |
| 5,958,508 A | 9/1999 | Adetutu et al. |
| 6,045,954 A | 4/2000 | Dai et al. |
| 6,096,640 A | 8/2000 | Hu |
| 6,245,669 B1 | 6/2001 | Fu et al. |
| 6,903,425 B2 | 6/2005 | Tang et al. |
| 7,071,049 B2 | 7/2006 | Tang et al. |
| 7,211,479 B2 | 5/2007 | Tang et al. |

*Primary Examiner*—David A Zarneke
(74) *Attorney, Agent, or Firm*—Dinsmore & Shohl LLP

(57) ABSTRACT

Semiconductor devices and memory cells are formed using silicon rich barrier layers to prevent diffusion of dopants from differently doped polysilicon films to overlying conductive layers or to substrates. A polycilicide gate electrode structure may be formed using the silicon rich barrier layers. Methods of forming the semiconductor devices and memory cells are also provided.

13 Claims, 5 Drawing Sheets

SILICON RICH BARRIER LAYERS FOR INTEGRATED CIRCUIT DEVICES

CROSS REFERENCE TO RELATED APPLICATIONS

This application is a divisional of U.S. Continuation application Ser. No. 11/625,846, filed Jan. 23, 2007 (MIO 0098 N2/01-0469.03). This application, which is also listed below for clarity, is also a member of the following family of related U.S. patent application Ser. No.: 10/212,561, filed Aug. 5, 2002 (MIO 0098 PA/01-0469.00), now U.S. Pat. No. 6,903, 425; Ser. No. 10/929,174, filed Aug. 30, 2004 (MIO 0098 VA/01-0469.01), now U.S. Pat. No. 7,071,049; Ser. No. 11/430,792, filed May 9, 2006 (MIO 0098 NA/01-0469.02), now U.S. Pat. No. 7,211,479; Ser. No. 11/625,846, filed Jan. 23, 2007 (MIO 0098 N2/01-0469.03) and Ser. No.12/120, 555, filed May 14, 2008 (MIO 0098 V2/01-0469.04).

BACKGROUND OF THE INVENTION

The present invention relates to the suppression of cross diffusion and/or penetration in integrated circuit devices. More particularly, the present invention relates to a scheme for utilizing silicon rich barrier layers to suppress cross diffusion and penetration in memory cells and logic devices.

Integrated circuit devices commonly employ a laminar or polycilicide structure composed of a polysilicon film and an overlying film of a metal, metal silicide, or metal nitride. In many cases, the polysilicon film comprises an N+ polysilicon region doped with an N type impurity and a P+ polysilicon region doped with a P type impurity. The present inventors have recognized that many P+ and N+ dopant materials are subject to migration from a given polysilicon layer to another polysilicon layer, to an overlying conductive layer, or to another region of the given polysilicon layer. As a result, these opposite types of impurities are subject to cross diffusion. Additionally, the dopants may penetrate through a dielectric layer to dope the semiconductor substrate. This penetration may cause unwanted threshold voltage ($V_t$) shift in the semiconductor.

Accordingly, there is a need for a scheme for suppressing cross diffusion of dopant materials between oppositely doped regions of polysilicon layer and penetration of dopant material into the substrate in integrated circuit devices.

SUMMARY OF THE INVENTION

The present invention overcomes the disadvantages of the prior art by providing semiconductor devices having silicon rich barrier layers arranged to impede the movement of dopants from polysilicon layers to other layers of the semiconductor device. The silicon rich barrier layers may be silicon rich silicon nitride, silicon rich silicon oxynitride, or combinations thereof. A polycilicide gate electrode structure for use in a memory cell may be formed in accordance with the present invention. The polycilicide gate electrode structure may have a polysilicon film having differently doped areas with a first silicon rich barrier layer disposed between the polysilicon film and a substrate and a second silicon rich barrier layer disposed between the polysilicon film and a conductive layer.

Accordingly, it is an object of the present invention to provide silicon rich barrier layers disposed to prevent cross diffusion and penetration in semiconductor devices.

Further, it is an object of the present invention to provide a memory cell having a polycilicide gate structure having silicon rich barrier layers to prevent cross diffusion and penetration from a polysilicon film in the polycilicide gate structure.

Further, it is an object of the present invention to provide methods of forming semiconductor devices having silicon rich barrier layers.

Additional objects and advantages of the present invention will become apparent from the subsequent drawings and detailed description of the preferred embodiments.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical, and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein only if those steps are necessary for an understanding of the present invention.

Figure 1:
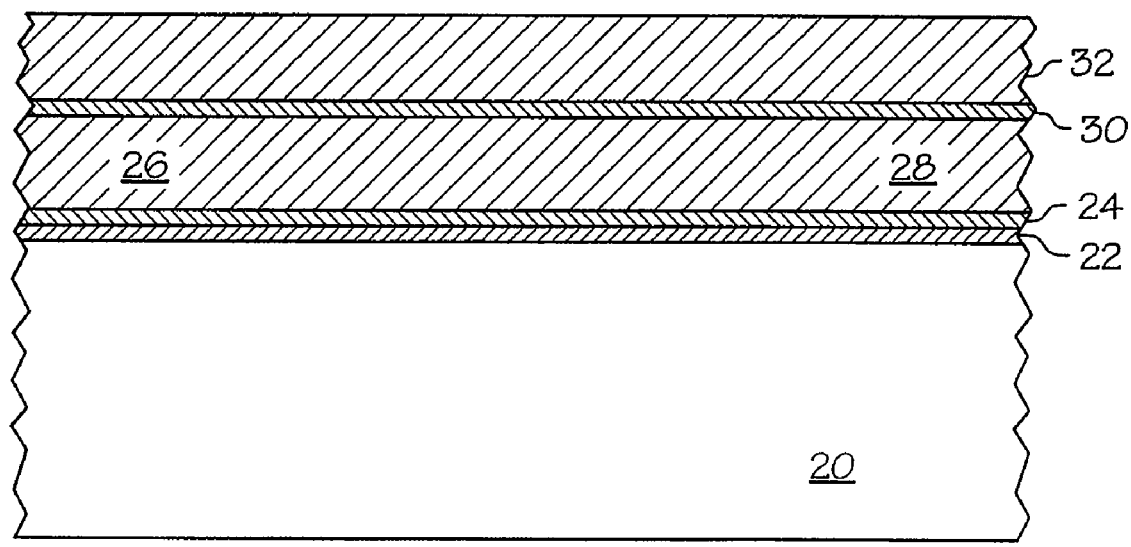
FIG. 1 is a cross-sectional view of a portion of a semiconductor device having silicon rich barrier layers.

In FIG. 1, a portion of a semiconductor device employing silicon rich barrier layers is illustrated. The device includes a semiconductor substrate 20. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The semiconductor substrate 20 may comprise silicon or polysilicon, and the semiconductor substrate 20 may have structures (not shown) formed therein.

A first silicon rich barrier layer 24 may be formed proximate to the semiconductor substrate 20. The first silicon rich barrier layer 24 generally comprises a layer having silicon and nitrogen. For example, the first silicon rich barrier layer 24 may comprise silicon rich silicon nitride, silicon rich silicon oxynitride, and combinations thereof. For purposes of defining and describing the present invention, the term "silicon rich" is defined as meaning containing more than the molar percentage of silicon of a stoichiometric layer containing silicon, nitrogen, and/or oxygen components and any impurities. The first silicon rich barrier layer 24 may be from about 25 Å to about 1000 Å thick, and the first silicon rich barrier layer 24 will more generally from about 50 Å to about 100 Å thick.

Any suitable process may be used to form the first silicon rich barrier layer 24. For example, the first silicon rich barrier layer 24 may be formed by chemical vapor deposition (CVD) or by plasma enhanced chemical vapor deposition (PECVD). When the first silicon rich barrier layer 24 is a silicon rich silicon nitride layer, the layer 24 may be formed in a PECVD chamber using a gas flow including a silicon source gas and a nitrogen source gas. For example, the nitrogen source gas may be, but is not limited to, ammonia ($NH_3$), nitrogen ($N_2$), nitrogen trifluoride ($NF_3$), or combinations thereof. The silicon source gas may be, but is not limited to, silane ($SiH_4$), dichlorosilane ($SiH_2Cl_2$), trichlorosilane ($SiHCl_3$), or combinations thereof. Generally, the gas flow will comprise a 6:1 ratio of a nitrogen source gas to a silicon source gas.

If the first barrier layer 24 comprises silicon nitride, the layer 24 may have a silicon molar percentage of from about 65 to about 90 percent, and the first barrier layer 24 will more generally have a silicon molar percentage of about 80 to about 90 percent. If the first barrier layer 24 comprises silicon oxynitride, the layer 24 may have a silicon molar percentage of about 55 to about 90 percent.

The semiconductor device may optionally have a gate oxide layer 22 formed between the semiconductor substrate 20 and the first silicon rich barrier layer 24. The gate oxide layer 22 may be formed over or on the semiconductor substrate 20. The gate oxide layer 22 generally comprises a thin silicon dioxide ($SiO_2$) layer formed by suitable oxidation methods on a silicon substrate A polysilicon film having first 26 and second 28 regions is generally formed over the first silicon rich barrier layer 24. The first 26 and second 28 regions are generally differently doped regions. For example, first region 26 of the polysilicon film may be doped with a P type dopant such as boron (B) to form a P+ region. The second region 28 may be doped with an N type dopant such as arsenic (As) or phosphorous (P) to form an N+ region. The first region 26 and the second region 28 are generally adjacent to one another. Suitable processes may be used to form the polysilicon film. For example, an undoped polysilicon film may be deposited by CVD or PECVD and differently doped by an ion implant in subsequent processing. The polysilicon film may be from about 50 Å to about 800 Å thick and will generally be about 600 Å thick.

A second silicon rich barrier layer 30 comprising silicon and nitrogen is generally formed over the first and second regions 26, 28 of the polysilicon film. The second silicon rich barrier layer 30 may be a silicon nitride layer or a silicon oxynitride layer, and it may be formed in accordance with the processes described in conjunction with the first silicon rich barrier layer 24. The second silicon rich barrier layer 30 may be from about 25 Å to about 1000 Å thick, and the second silicon rich barrier layer 30 will more generally from about 50 Å to about 100 Å thick. If the second barrier layer 30 comprises silicon nitride, the layer 30 may have a silicon molar percentage of from about 65 to about 90 percent, and the second barrier layer 30 will more generally have a silicon molar percentage of about 80 to about 90 percent. If the second barrier layer 30 comprises silicon oxynitride, the layer 30 may have a silicon molar percentage of about 55 to about 90 percent.

A conductive layer 32 generally overlies the second silicon rich barrier layer 30. The conductive layer 32 may be made of any conductive material. For example, the conductive layer 32 may be, but is not limited to, a metal, a metal silicide, or a metal nitride film. The conductive layer 32 may be a tungsten silicide film. The conductive layer may be deposited using suitable methods.

In conventional semiconductor devices, P type and N type dopants are subject to migration from a given portion of a polysilicon layer to another portion of the polysilicon layer where the layer is covered by a conductive layer. Specifically, the differently doped layers in conventional semiconductor devices are subject to cross diffusion where the dopants migrate to the differently doped area through the conductive layer. Additionally, the dopants from the polysilicon layer may diffuse through any underlying layers to dope the substrate causing unwanted threshold voltage ($V_t$) shift in the semiconductor. According to the present invention, the first barrier layer 24 prevents the dopants from the first region 26 and the second region 28 of the polysilicon film from doping the substrate 20. Generally, the first barrier layer 24 significantly impedes migration of the dopants to the substrate 20. Similarly, the second barrier layer 30 prevents cross diffusion of dopants from the first region 26 to the second region 28 or from the second region 28 to the first region 26 of the polysilicon film. Generally, the second barrier layer 30 significantly impedes migration of dopants to the conductive layer 32.

It is noted that only a portion of the layers are shown in FIG. 1 without accompanying additional structure because the manner in which the layers are patterned and configured is largely dependent on design constraints of the specific semiconductor device structure and is outside the scope of the present invention. The present invention relates primarily to the prevention of cross diffusion and substrate doping in semiconductor devices having adjacent differently doped polysilicon regions.

Figure 2:
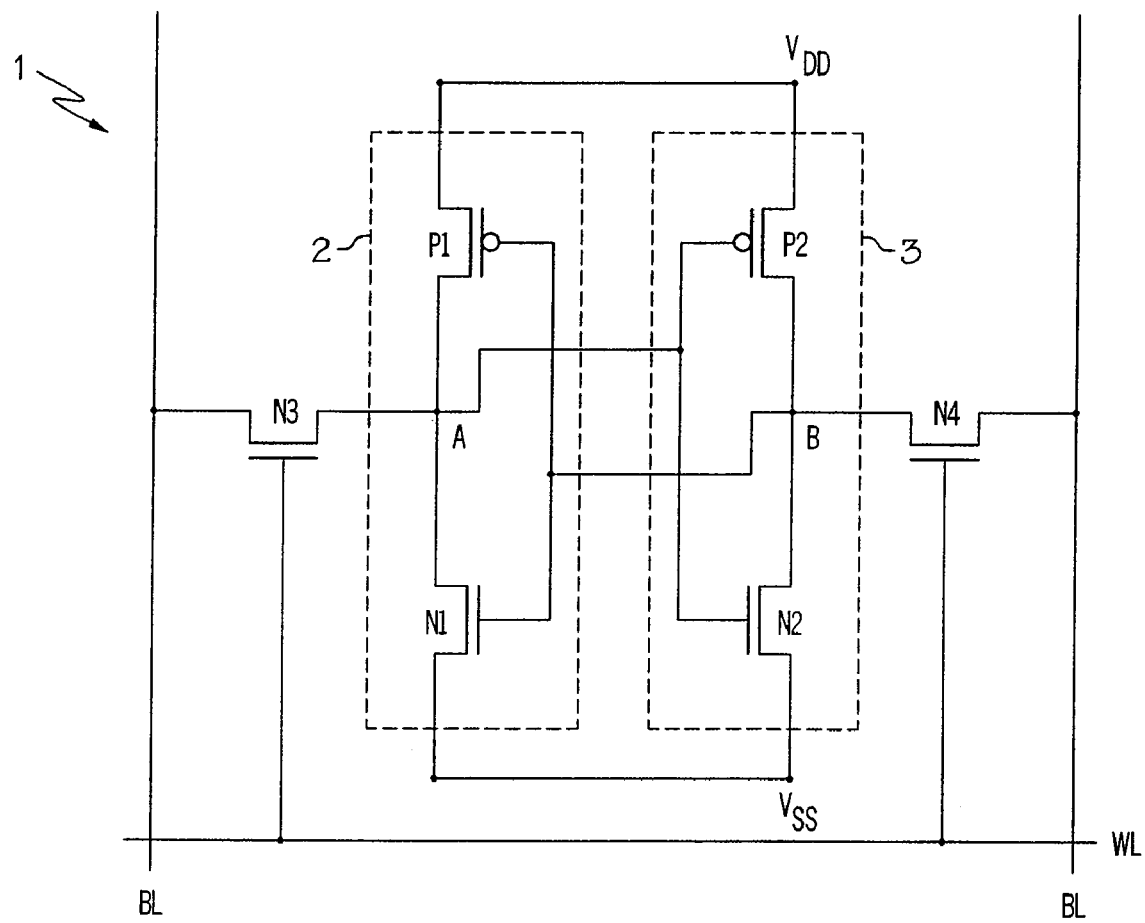
FIG. 2 is a schematic circuit diagram of a six transistor SRAM cell.
Figure 3:
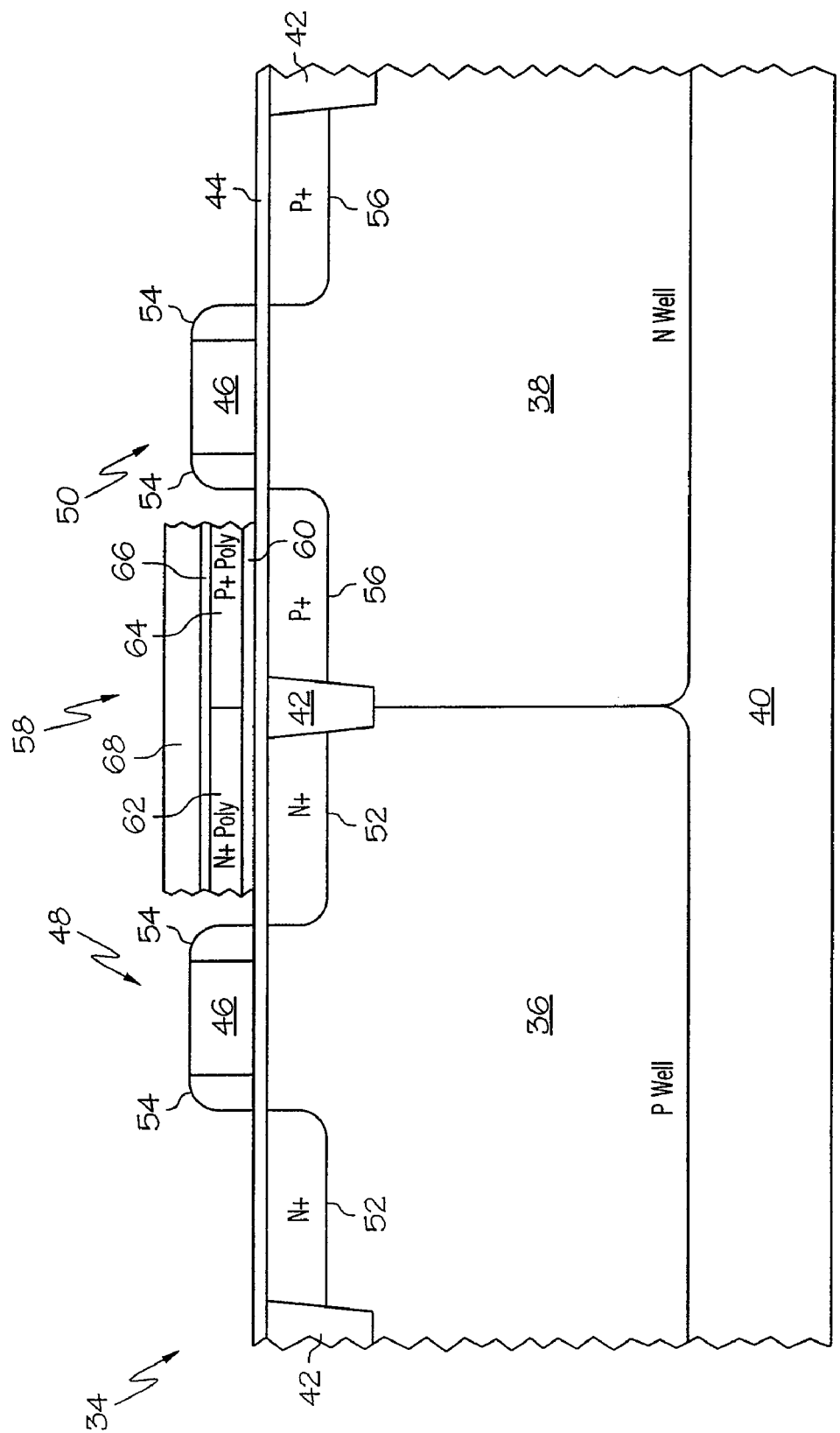
FIG. 3 is a cross-sectional view of a CMOS structure used in the SRAM cell illustrated in FIG. 2.

The present invention may be illustrated in the context of a six transistor static random access memory cell (See FIGS. 2 and 3). Most metal oxide semiconductor (MOS) static random access memories (SRAMs) have in common a basic cell consisting of two transistors and two load elements in a flip-flop configuration, together with two access transistors. For example, FIG. 2 presents a schematic circuit diagram of a six transistor (6T) SRAM cell. The SRAM cell 1 includes two N type MOS (NMOS) transistors N1 and N2 coupled between $V_{SS}$ and nodes A and B, respectively. Nodes A and B are further coupled to $V_{DD}$ by pull up P type MOS (PMOS) transistors P1 and P2, respectively. Node A is further coupled to the gates of transistors P2 and N2 and node B is similarly coupled to the gates of transistors P1 and N1. $V_{SS}$ is typically ground and $V_{DD}$ is typically 3.3 volts or 5.0 volts.

Information is stored in SRAM cell 1 in the form of voltage levels in the flip-flop formed by the two cross-coupled inverters 2 and 3 formed by transistors P1, N1 and P2, N2, respectively. Specifically, when node A is at a logic low state, i.e., when the voltage of node A is approximately equal to $V_{SS}$, transistor P2 is on and transistor N2 is off. When transistor P2 is on and transistor N2 is off, node B is at a logic high state, i.e., the voltage of node B is pulled up to approximately $V_{DD}$. When node B is at a logic high state, transistor P1 is off and transistor N1 is on. When transistor P1 is off and transistor N1 is on, node A is at a logic low state. In this manner, SRAM cell 1 remains in a latched state.

Nodes A and B are further coupled to bit lines BL by NMOS access transistors N3 and N4, respectively. The gates of transistors N3 and N4 are coupled to a word line WL to enable conventional read and write operations.

FIG. 3 is a cross-sectional view of a conventional complimentary metal oxide semiconductor (CMOS) structure 34 used in conventional 6T SRAM cells like the one described with reference to FIG. 2. A P well 36 and an N well 38 are formed adjacent to each other in a semiconductor substrate 40. Isolation regions 42 are formed at the surface of the substrate 40. A gate oxide layer 44 is formed over the substrate 40 above the N well 38 and the P well 36. Conductive gates 46 are formed above the P well 36 and the N well 38, and sidewall spacers 54 are formed adjacent to the conductive gates. The conductive gates 46 form part of an NMOS transistor 48 and a PMOS transistor 50. NMOS transistor 48 has N+ source/drain regions 52 formed in the P well 36, and PMOS transistor 50 has P+ source/drain regions 1 formed in the N well 38. The PMOS transistor 50 defines a P type active region in the N Well 38. The NMOS transistor 48 defines an N type active region in the P well 36. The isolation regions 42 isolate the P type active regions from the N type active regions. The PMOS transistor 50 may be a pull up transistor of an SRAM cell, and the NMOS transistor 48 may be a pull down/access transistor of an SRAM cell. The wells 36, 38, isolation regions 42, gate oxide layer 44, gates 46, sidewall spacers 52, and transistors 48, 50 may be formed using suitable processing techniques.

The gate electrode structure of the CMOS structure 34 is constructed to have a laminar or polycilicide structure composed of a polysilicon film and an overlying conductive layer. Specifically, the polysilicon film comprises an N+ polysilicon layer 62 formed over the NMOS transistor 48 and a P+ polysilicon layer 64 formed over the PMOS transistor 50. Each of the polysilicon layers 62, 64 generally provide a connection to a transistor gate 46. The conductive layer 68 may be of any suitable conductive material, and the layer 68 may be, but is not limited to, a metal, metal silicide, or metal nitride film. For example, the conductive layer 68 may be a tungsten silicide film.

The polycilicide structure also has first and second silicon rich barrier layers 60 and 66. The first silicon rich barrier layer 60 is formed under the N+ and P+ polysilicon layers 62, 64 between the polysilicon film and the substrate 40. The second silicon rich barrier layer 66 is formed over the N+ and P+ polysilicon layers 62, 64 between the polysilicon film and the conductive layer 68. The first silicon rich barrier layer 60 is generally arranged to significantly impede the migration of N+ and P+ type dopants from the polysilicon film to the underlying gate oxide layer 44 or the substrate 40. The second silicon rich barrier layer 66 is generally arranged to significantly impede the migration of N+ and P+ type dopants from the polysilicon film to the conductive layer 68. The first silicon rich barrier layer 60 may be from about 25 Å to about 1000 Å thick, and the first barrier layer 60 will generally be from about 50 Å to about 100 Å thick. The second silicon rich barrier layer 66 may be from about 25 Å to about 1000 Å thick, and the second barrier layer 66 will generally be from about 50 Å to about 100 Å thick. The polycilicide structure may be formed in using the processes already described herein.

The first and second barrier layers 60, 66 may be silicon rich silicon nitride or silicon rich silicon oxynitride. When the first or second barrier layer 60, 66 comprises silicon rich silicon nitride, the first or second barrier layer 60, 66 may have a silicon molar percentage of about 65 to about 90 percent, and the first or second barrier layer 60, 66 will generally have a silicon molar percentage of about 80 to about 90 percent. When the first or second barrier layer 60, 66 comprises silicon rich silicon oxynitride, the first or second barrier layer 60, 66 may have a silicon molar percentage of about 55 to about 90 percent.

As with the semiconductor device shown in FIG. 1, only portions of the layers are illustrated in FIG. 3 because the manner in which they are patterned and configured is largely dependent on the design constraints of the specific integrated circuit structure.

Figure 4:
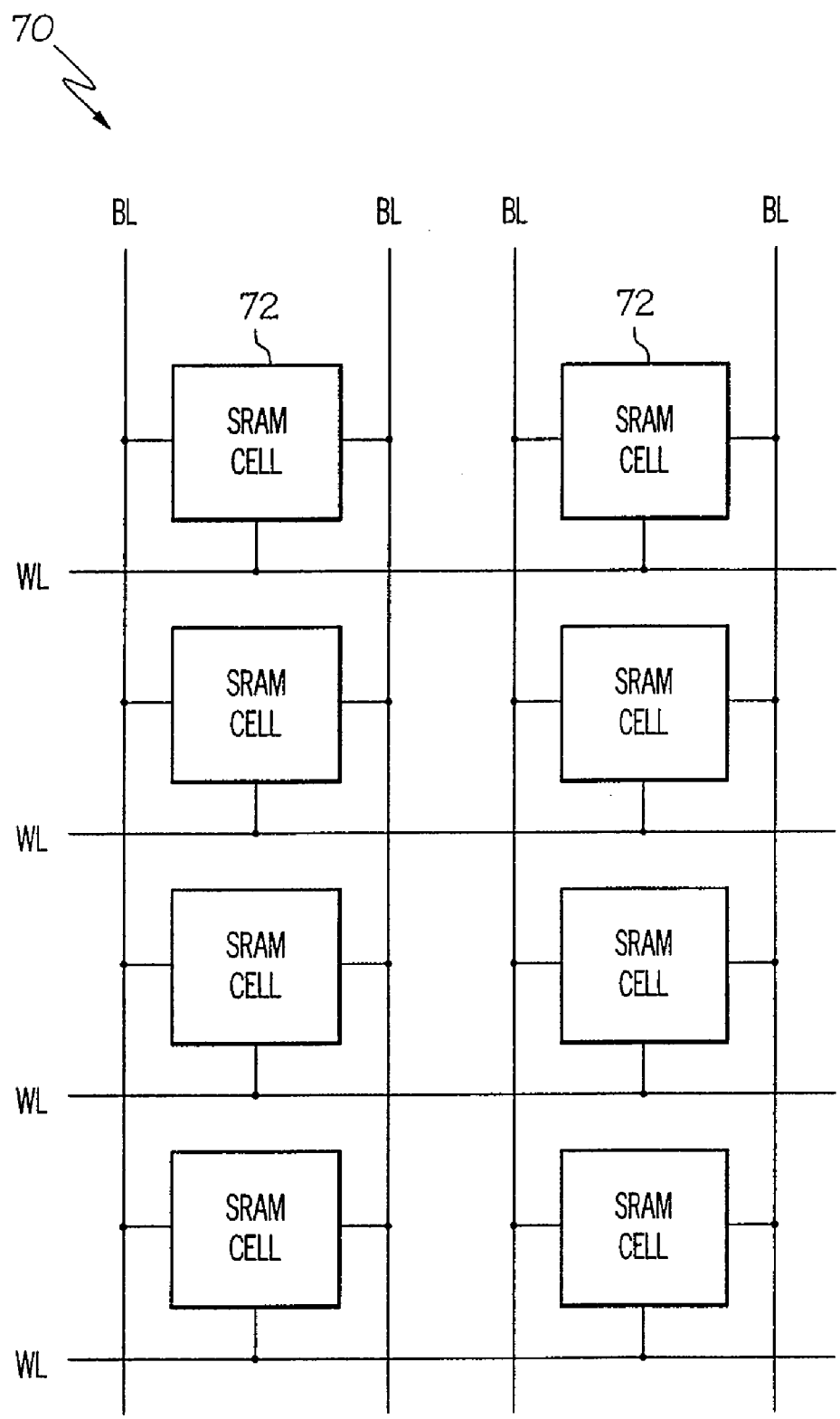
FIG. 4 is an illustration of an SRAM cell array according to the present invention.
Figure 5:
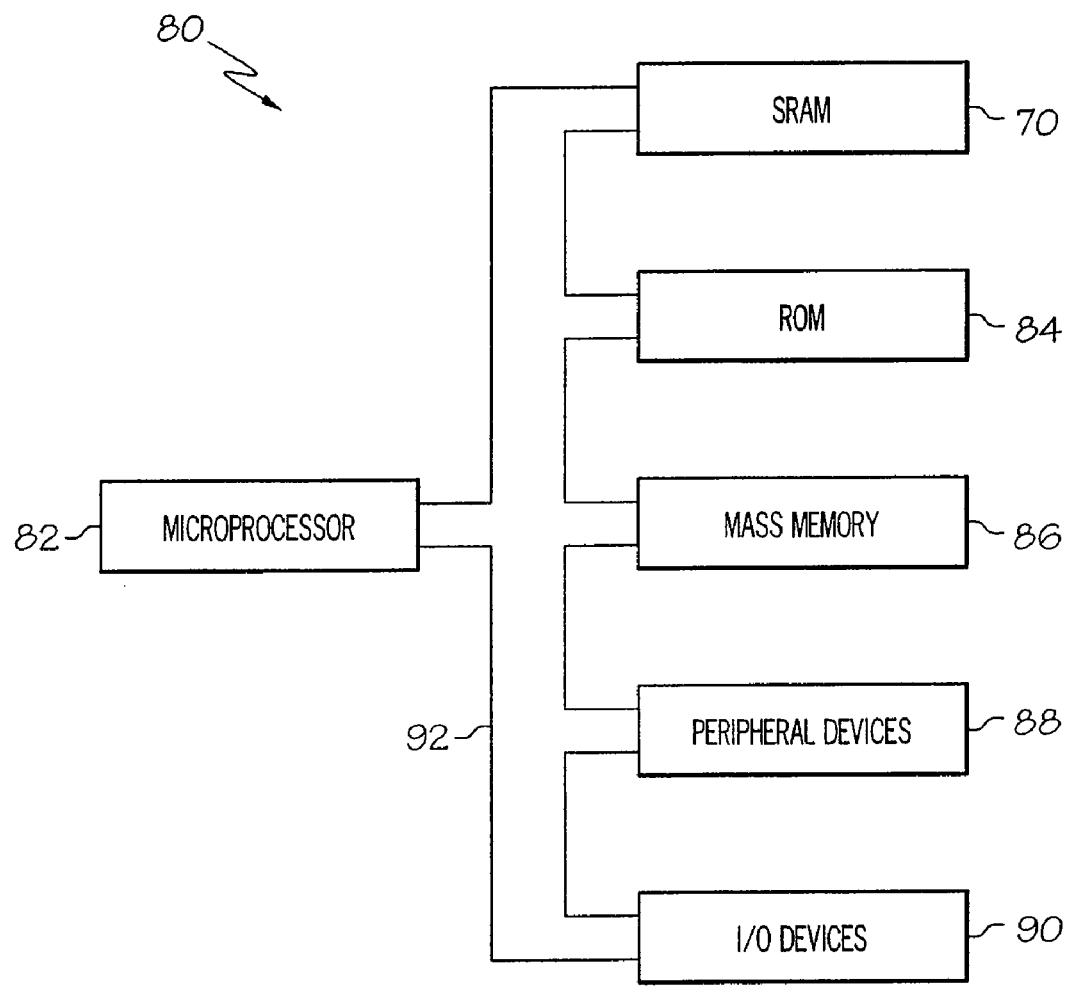
FIG. 5 is a schematic block diagram of a computer system according to the present invention.

Referring to FIG. 4, an SRAM cell array 70 embodying the present invention is illustrated. The array 70 includes a number of SRAM cells 72 arranged in rows and columns. Each cell 72 is connected to a word line WL and to a pair of bit lines BL. A computer system 80 including a microprocessor 82 in communication with an SRAM cell 70 of the present invention is illustrated in FIG. 5. The computer system 80 further includes ROM 84, mass memory 86, peripheral devices 88, and I/O devices 90, all in communication with the microprocessor 62 via a data bus 92 or another suitable data communication path. To fabricate the memory cell 70 of FIG. 3, the SRAM cells 72 are arranged in rows and columns and each SRAM cell 72 of the array 70 is connected to a word line WL and to a pair of bit lines BL. To fabricate the computer system 80, the 82 is arranged in communication with the memory cell array 70 via a data communication path 92.

It will be obvious to those skilled in the art that various changes may be made without departing from the scope of the invention, which is not to be considered limited to what is described in the specification.

The invention claimed is:

1. A method of forming a semiconductor device comprising a silicon rich barrier layer, a polysilicon film, a conductive layer, and a semiconductor substrate, wherein:
    the polysilicon film comprises a first region having a first type dopant and a second region having a second type dopant; and
    the silicon rich silicon barrier layer is formed such that migration of the first and second type dopants from the polysilicon film to either the conductive layer, the semiconductor substrate, another polysilicon layer in the device, or another region of the polysilicon film is significantly impeded by the silicon rich barrier layer.

2. The method as claimed in claim 1 wherein the silicon rich barrier layer is formed over the semiconductor substrate.

3. The method as claimed in claim 1 wherein the silicon rich barrier layer comprises silicon rich silicon nitride, silicon rich silicon oxynitride, or combinations thereof.

4. The method as claimed in claim 1 wherein:
    the silicon rich barrier layer comprises a silicon rich silicon nitride layer; and
    the silicon rich silicon nitride layer has a silicon molar percentage of about 65 to about 90 percent.

5. The method as claimed in claim 1 wherein:
    the silicon rich barrier layer comprises a silicon rich silicon nitride layer; and
    the silicon rich silicon nitride layer has a silicon molar percentage of about 80 to about 90 percent.

6. The method as claimed in claim 1 wherein the first type dopant comprises an N-type dopant, and the second type dopant comprises a P-type dopant.

7. The method as claimed in claim 1 wherein the conductive layer comprises a metal, metal silicide, or metal nitride film.

8. The method as claimed in claim 1 wherein the conductive layer comprises a tungsten silicide film.

9. The method as claimed in claim 1 wherein the silicon rich barrier layer is about 25 Å to about 1000 Å thick.

10. The method as claimed in claim 1 wherein the silicon rich barrier layer is about 50 Å to about 100 Å thick.

11. The method as claimed in claim 1 further comprising forming a gate oxide layer proximate to the semiconductor substrate of the semiconductor device.

12. A method of forming a semiconductor device comprising a silicon rich barrier layer, a polysilicon film, a conductive layer, and a semiconductor substrate, wherein:

the polysilicon film comprises a first region having a first type dopant and a second region having a second type dopant; and the silicon rich silicon barrier layer is formed to impede migration of the first and second type dopants from the polysilicon film to an extent sufficient to prevent threshold voltage shift in the semiconductor device.

13. The method as claimed in claim 12 wherein:

the silicon rich barrier layer comprises a silicon rich silicon nitride layer; and the silicon rich silicon nitride layer has a silicon molar percentage of about 65 to about 90 percent.

* * * * *